United States Patent
Horibe (10) Patent No.: US 6,787,927 B2
(45) Date of Patent: Sep. 7, 2004

(54) SEMICONDUCTOR DEVICE AND WIRE BONDING APPARATUS

(75) Inventor: Hiroshi Horibe, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/050,166

(22) Filed: Jan. 18, 2002

(65) Prior Publication Data

US 2003/0042622 A1 Mar. 6, 2003

(30) Foreign Application Priority Data

Aug. 27, 2001 (JP) .......................................... 2001-256892

(51) Int. Cl.[7] .......................... H01L 23/48; H01L 23/52; H01L 29/40
(52) U.S. Cl. ........................ 257/784; 257/787; 257/666; 257/690
(58) Field of Search ................................ 257/784, 787, 257/690, 666, 775; 228/180.5

(56) References Cited

U.S. PATENT DOCUMENTS 5,156,323 A * 10/1992 Kumazawa et al. ........ 228/179
5,847,445 A * 12/1998 Wark et al. .................. 257/669
6,372,625 B1 * 4/2002 Shigeno et al. ............. 438/617

* cited by examiner

Primary Examiner—Steven Rohe
Assistant Examiner—Nitin Parekh
(74) Attorney, Agent, or Firm—McDermott Will & Emery LLP (57) ABSTRACT

A semiconductor device comprises a chip; a plurality of bonding pads provided on the chip; and a plurality of inner leads arranged opposite to the bonding pads. Further the semiconductor device comprises a plurality of bonding wires electrically connecting the bonding pads and the corresponding inner leads, respectively. Each of the bonding wires has a plurality of bends electrically isolated from conductive parts on the chip, and the bonding pads are arranged at optional positions on a surface of the chip. Hence the shorting of the chip by the bonding wires can be reliably prevented, the bonding wire having a high mechanical strength can be stably fed, the bonding pads may be optionally arranged on the chip, the degree of freedom of designing the layout of the internal circuit of the chip is high, and the semiconductor device and the wire bonding apparatus can be developed at a high efficiency.

5 Claims, 6 Drawing Sheets

SEMICONDUCTOR DEVICE AND WIRE BONDING APPARATUS

BACKGROUND OF THE INVENTION

1. Field of the Invention

The present invention relates to a semiconductor device and a wire bonding apparatus and, more particularly, to a semiconductor device fabricated by interconnecting inner leads and bonding pads formed on a surface of a chip at a level above that of the surfaces of the inner leads, and a wire bonding apparatus for use for fabricating such a semiconductor device.

2. Background Art

There has been demand for producing inexpensive, stable semiconductor devices by enhancing the efficiency of development of chips for fabricating semiconductor devices.

A chip included in a semiconductor device is provided internally with an integrated circuit, and a plurality of bonding pads formed on a surface of the chip. Electric signals are exchanged through the bonding pads between the internal integrated circuit of the chip and an external circuit.

When fabricating a semiconductor device, a chip provided with bonding pads is mounted on a die pad (island) formed in a leadframe provided with a plurality of inner leads arranged around the die pad and respectively corresponding to the bonding pads.

A wire bonding apparatus interconnects the plurality of inner leads and the plurality of bonding pads electrically with bonding wires (metal loops).

After the interconnection of the bonding pads and the inner leads by the wire bonding apparatus has been completed, the chip, the inner leads and the bonding wires are sealed in a resin package.

Such a conventional semiconductor device as mentioned above is subject to a restriction requiring the arrangement of the bonding pads in a peripheral area of a surface of the chip. Therefore, it has been difficult to improve the efficiency of developing semiconductor devices greatly.

More specifically, it is possible that the internal circuit of the chip is shorted if the bonding wire touches the chip. Therefore, the bonding pads are not arranged in a central area of the surface of the chip and are arranged in a peripheral area of the surface of the chip. Such a restriction on the arrangement of the bonding pads places restrictions on the layout of the internal circuit of the chip; that is the layout of the internal circuit must be determined so as to adjust to the arrangement of the bonding pads in the peripheral area of the surface of the chip.

SUMMARY OF THE INVENTION

The present invention has been made to solve such a problem and it is therefore an object of the present invention to provide a semiconductor device having a high degree of freedom of designing the layout of its internal circuit and capable of being developed at high efficiency.

According to one aspect of the present invention, a semiconductor device comprises a chip; a plurality of bonding pads provided on the chip; and a plurality of inner leads arranged opposite to the bonding pads. Further the semiconductor device comprises a plurality of bonding wires electrically connecting the bonding pads and the corresponding inner leads, respectively. Each of the bonding wires has a plurality of bends electrically isolated from conductive parts on the chip, and the bonding pads are arranged at optional positions on a surface of the chip.

According to another aspect of the present invention, a wire bonding apparatus is used for fabricating the above semiconductor device.

According to another aspect of the present invention, a wire bonding apparatus for electrically interconnecting a plurality of bonding pads arranged on a chip, and a plurality of inner leads arranged on a leadframe by bonding wires, is configured to set respective ratios of distances between the bonding pad and bends to be formed in each bonding wire to an overall length of the bonding wire between the bonding pad and the inner lead as viewed from above a major surface of the chip. Further the wire bonding apparatus is configured to form the plurality of bends electrically insulated from conductive parts on the chip at positions corresponding to the ratios.

Other and further objects, features and advantages of the invention will appear more fully from the following description.

DETAILED DESCRIPTION OF THE PREFERRED EMBODIMENTS

Preferred embodiments of the present invention will be described with reference to the accompanying drawings, in which like or corresponding parts are denoted by the same reference characters, and duplicate description of the same parts will be omitted.

First Embodiment

Figure 1:
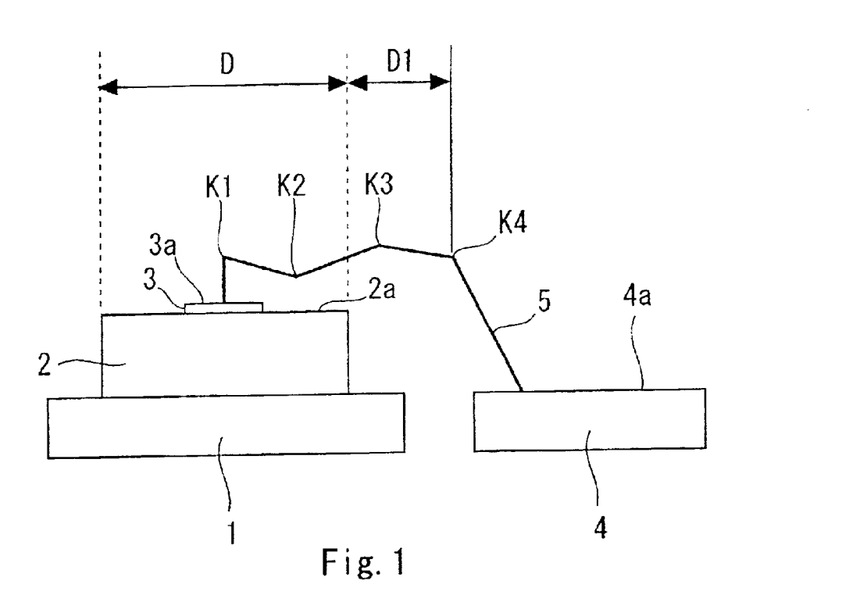
FIG. 1 is a schematic view of a semiconductor device according to the first embodiment of the present invention.

Hereinafter, a first embodiment according to the present invention will be described in detail with reference to FIG.

1. FIG. 1 is a schematic view of a semiconductor device according to the first embodiment of the present invention. Referring to FIG. 1, the semiconductor device includes a die pad 1, a chip 2 provided with an internal circuit and mounted on the die pad 1, a surface (major surface) 2a of the chip 2, a bonding pad 3 formed on the surface 2a of the chip 2, a surface 3a of the bonding pad 3, an inner lead 4 disposed opposite to the bonding pad 3, a surface 4a of the inner lead 4, a bonding wire (metal loop) 5 electrically interconnecting the bonding pad 3 and the inner lead 4, bends K1 to K4 in the bonding wire 5.

Actually, the semiconductor device has a plurality of bonding pads 3, a plurality of inner leads 4 and a plurality of bonding wires 5, only one of the bonding pads 3, one of the inner leads 4 and one of the bonding wires 5 are shown in FIG. 1 for simplicity.

The bends K1, K2, K3 and K4 are formed in the bonding wire 5 in that order from the side of the bonding pad 3 toward the inner lead 4. The bends K1 to K4 are formed by bending the bonding wire 5. The bends K1 to K4 have a function similar to that of joints of a rigid frame; that is the bends K1 to K4 strengthen the bonding wire 5 to withstand external force that may act on the bonding wire 5 and maintains the original shape of the bonding wire 5.

All the bends K1 to K4 are apart from the surface 2a of the chip 2 such that the bends K1 to K4 are electrically isolated from conductive parts of the chip 2. Thus, the bends k1 to K4 do not touch the chips 2 electrically.

The nearest bend K4 to the inner lead 4 among the bends K1 to K4 is outside a range D extending over the chip 2 and is spaced a distance D1 from a limit on the side of the inner lead 4 of the range D toward the inner lead 4. Thus, the bend K4 is positioned on the side of the inner lead 4 with respect to a side surface (edge) facing the inner lead 4 of the chip 2.

The plurality of bonding pads 3 is distributed in a peripheral area and a central area of the surface 2a of the chip 2. The internal circuit of the chip 2 is formed in a free layout and the bonding pads 3 are formed in a central area or a peripheral area of the surface 2a of the chip 2 according to the layout of the internal circuit.

In FIG. 1, the bonding pads 3 are arranged substantially in a central area of the surface 2a of the chip 2. When the bonding pads are thus arranged in the central area of the surface 2a of the chip 2, the length of the bonding wire 5 extending over the chip 2 (on-chip length) as viewed from above the major surface (the surface 2a) of the chip 2 is on the order of 30% of the entire length of the bonding wire 5 as viewed from above the major surface of the chip 2.

The semiconductor device thus constructed as shown in FIG. 1 is sealed in a sealing resin. When sealing the semiconductor device in the sealing resin, the bonding wires 5 having the bends K1 to K4 withstand pressure exerted thereon by the sealing resin and is scarcely subject to deformation.

In the semiconductor device thus fabricated, the internal circuit of the chip 2 and an external circuit exchange electric signals through the bonding wires 5 and the inner leads 4.

As apparent from the foregoing description, the mechanically strong bonding wires 5 of the semiconductor device in the first embodiment are capable of reliably preventing the shorting of the chip 2 by the bonding wires 5. The bonding pads 3 can be arranged at optional positions on the chip 2, and hence the degree of freedom of designing the layout of the internal circuit of the chip 2 can be increased.

When fabricating the semiconductor device in the first embodiment, a wire bonding apparatus interconnects the bonding pads 3 of the chip 2 and the inner leads 4 by the bonding wires 5. The bonding apparatus extends the bonding wire 5 from the surface 3a of the bonding pad 3 to the surface 4a of the inner lead 4 or from the surface 4a of the inner lead 4 to the surface 3a of the bonding pad 3, forming the bends K1 to K4 in the bonding wire 5.

While four bends K1 to K4 are formed in the bonding wire in the first embodiment, the number of the bends is not limited to four.

Second Embodiment

Figure 2:
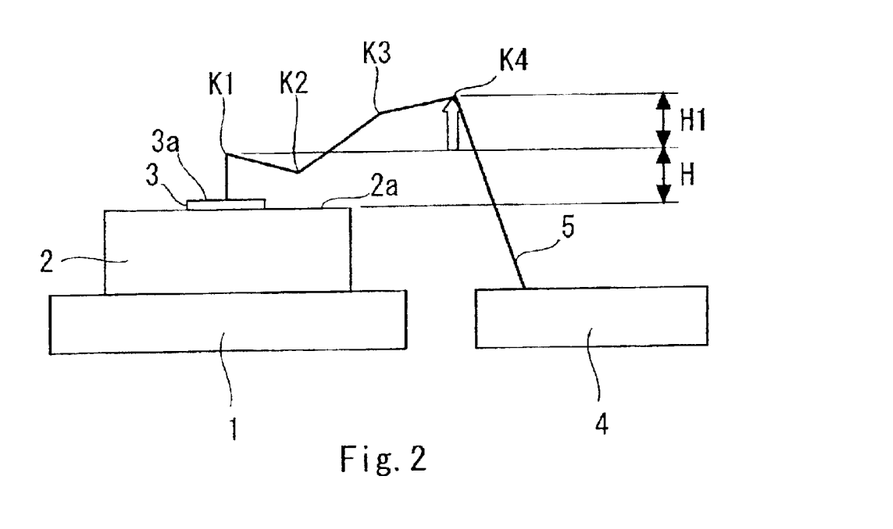
FIG. 2 is a schematic view of a semiconductor device according to the second embodiment of the present invention.

Hereinafter, a second embodiment according to the present invention will be described with reference to FIG. 2. FIG. 2 is a schematic view of a semiconductor device according to the second embodiment of the present invention. The semiconductor device in the second embodiment differs from the semiconductor device in the first embodiment in the arrangement of the nearest bend K4 to the inner lead 4.

Referring to FIG. 2, the semiconductor device includes a die pad 1, a chip 2, a bonding pad 3, an inner lead 4, a bonding wire 5, and bends K1 to K4 formed in the bonding wire 5.

The bends K1 to K4, similarly to those of the bonding wire 5 of the first embodiment, are formed in that order from the side of the bonding pad 3. The nearest bend K4 to the inner lead 4 is at a level higher than that of the nearest bend K1 to the chip 2; that is, the height of the bend K4 from the surface 2a of the chip 2 is higher than the height H of the nearest bend K1 to the chip 2 by a height H1.

All the bends K1 to K4 are apart from the surface 2a of the chip 2 and are electrically isolated from conductive parts of the chip 2.

On the other hand, the bonding pads 3 are distributed in a peripheral area and a central area of the surface 2a of the chip 2.

The semiconductor device thus constructed is sealed in a sealing resin after that.

As apparent from the foregoing description, the mechanically strong bonding wires 5 of the semiconductor device in the second embodiment, similarly to those of the first embodiment, are capable of reliably preventing the shorting of the chip 2 by the bonding wires 5. The bonding pads 3 can be arranged at optional positions on the chip 2, and hence the degree of freedom of designing the layout of the internal circuit of the chip 2 can be increased.

Third Embodiment

Figure 3:
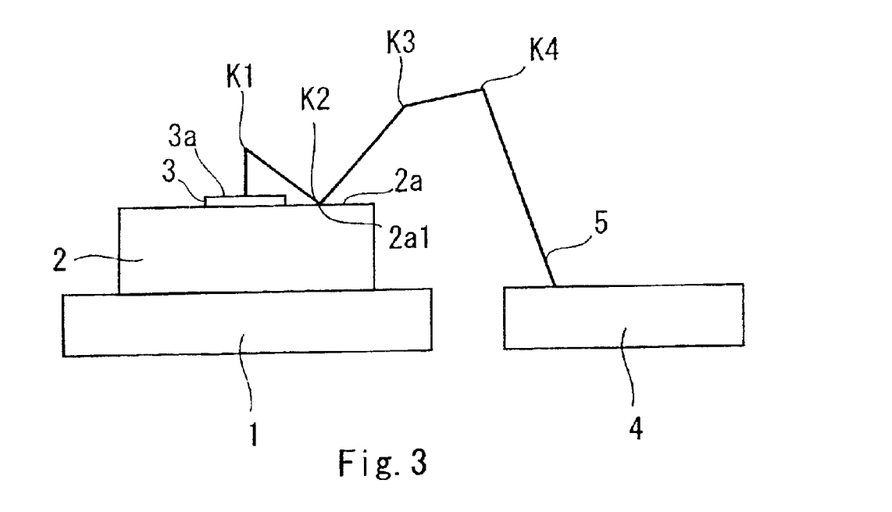
FIG. 3 is a schematic view of a semiconductor device according to the third embodiment of the present invention.

Hereinafter, a third embodiment according to the present invention will be described with reference to FIG. 3. FIG. 3 is a schematic view of a semiconductor device according to the third embodiment of the present invention. The present embodiment differs from the semiconductor devices in the first and the second embodiment in the position of one (bend K2) of a plurality of bends (bends K1 to K4) in each of bonding wires.

Referring to FIG. 3, there is shown the semiconductor device including a die pad 1, a chip 2, an electrically insulating part 2a1 in a surface 2a of the chip 2, a bonding pad 3, an inner lead 4, a bonding wire 5, and bends K1 to K4 formed in the bonding wire 5.

The bends K1 to K4, similarly to those of the bonding wire 5 of the foregoing embodiment, are formed in that order from the side of the bonding pad 3. The bend K2 is in contact with the electrically insulating part 2a1 of the chip 2. The electrically insulating part 2a1 is, for example, an insulating film formed on a part of the chip 2. Other bends K1, K3 and K4 are apart from the surface 2a of the chip 2. Thus, all the bends K1 to K4 are electrically isolated from conductive parts on the chip 2 and hence the bonding wires 5 will not short the chip 2.

The bonding pads 3 are distributed in a peripheral area and a central area of the surface 2a of the chip 2. The semiconductor device thus constructed is sealed in a sealing resin.

As apparent from the foregoing description, the mechanically strong bonding wires 5 of the semiconductor device in the third embodiments, similarly to those of the first and second embodiments, are capable of reliably preventing the shorting of the chip 2 by the bonding wires 5. The bonding pads 3 can be arranged at optional positions on the chip 2, and hence the degree of freedom of designing the layout of the internal circuit of the chip 2 can be increased.

In particular, the bonding wire 5 is supported by the three parts thereof, i.e., the opposite end parts and a middle part because the bend K2 of the same is in contact with the surface 2a of the chip 2. Thus, the structural strength of the bonding wire 5 is higher than those of the bonding wires 5 of the first and the second embodiment.

Although only the one bend K2 is in contact with the electrically insulating part 2a1 of the chip 2 in the third embodiment, the number and the position of bends to be in contact with the electrically insulating parts are not limited to those described above.

Fourth Embodiment

Figure 4:
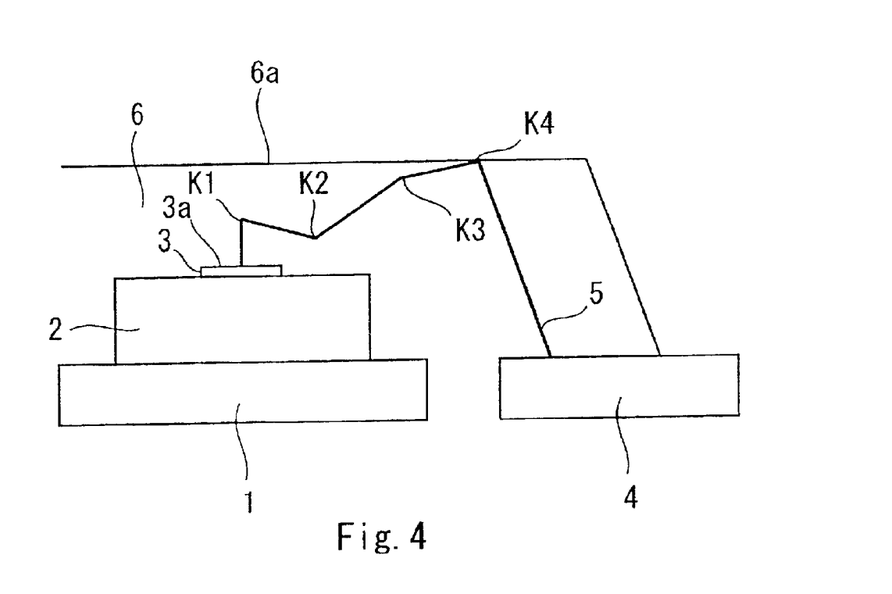
FIG. 4 is a schematic view of a semiconductor device according to the second embodiment of the present invention.

Hereinafter, a fourth embodiment according to the present invention will be described with reference to FIG. 4. FIG. 4 is a schematic view of a semiconductor device according to the second embodiment of the present invention. The semiconductor device differs from the semiconductor devices in the foregoing embodiments in the position of one (bend K4) of a plurality of bends (bends K1 to K4) in each of bonding wires.

Referring to FIG. 4, there is shown the semiconductor device including a die pad 1, a chip 2, a bonding pad 3, an inner lead 4, a bonding wire 5, a resin package 6 sealing the inner leads 4 and other components of the semiconductor device therein, a surface 6a of the resin package 6, and bends K1 to K4 formed in the bonding wire 5.

The bends K1 to K4, similarly to those of the bonding wires 5 of the foregoing embodiments, are formed in that order from the side of the bonding pad 3. The nearest bend K4 to the inner lead 4 is exposed in the surface 6a of the resin package 6, and the other bends K1 to K3 are embedded in the resin package 6.

All the bends K1 to K4 are electrically insulated from conductive parts of the chip 2 and hence the bonding wires 5 do not short the chip.

The bonding pads 3 are distributed in a peripheral area and a central area of the surface 2a of the chip 2.

As apparent from the foregoing description, the mechanically strong bonding wires 5 of the semiconductor device in the fourth embodiment, similarly to those of the foregoing embodiments, are capable of reliably preventing the shorting of the chip 2 by the bonding wires 5. The bonding pads 3 can be formed at optional positions on the chip 2, and hence the degree of freedom of designing the layout of the internal circuit of the chip 2 can be increased.

Since the bend K4 of the bonding wire 5 of the semiconductor device in the fourth embodiment are exposed on the surface 6a of the resin package 6, pressure that acts on the bonding wire 5 when a resin is poured into a mold to form the resin package 6 is partly reduced, and the maintenance of the original shape of the bonding wire 5 further ensured.

Although only the bend K4 is exposed in the surface 6a of the resin package 6 in the fourth embodiment, the number and the positions of bends exposed in the surface 6a of the resin package 6 are not limited to those described above.

Fifth Embodiment

Figure 5:
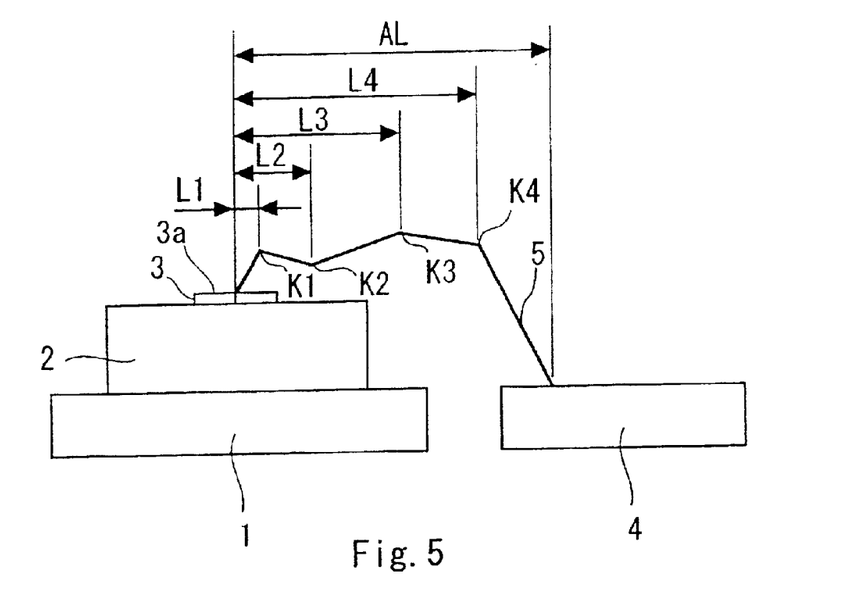
FIG. 5 is a schematic view of a semiconductor device fabricated by a method using the wire bonding apparatus in the fifth embodiment.

Hereinafter, a fifth embodiment according to the present invention will be described with reference to FIG. 5. FIG. 5 is a schematic view of a semiconductor device fabricated by a method using the wire bonding apparatus in the fifth embodiment.

Referring to FIG. 5, there are shown a die pad 1 included in a leadframe, not shown, a chip 2, a bonding pad 3, an inner lead 4 formed on the leadframe opposite to the bonding pad 3, a bonding wire 5, and bends K1 to K4 formed in the bonding wire 5.

Although the wire bonding apparatus in the fifth embodiment comprises components including a spool on which bonding wire 5 is wound, a guide pipe for guiding the bonding wire 5 unwound from the spool in a desired direction, an operating unit for operating the guide pipe, a controller for controlling the operating unit and such, the illustration of those components will be omitted for simplicity.

The wire bonding apparatus interconnects the bonding pad 3 and the inner lead 4 by the bonding wire 5.

After bonding the extremity of the bonding wire 5 to the bonding pad 3, the guide pipe is moved stepwise to form the bends K1, K2, K3 and K4 sequentially.

More specifically, the respective ratios of the distances between the bonding pad 3 and the bend K1, the bonding pad 3 and the bend K2, the bonding pad 3 and the bend K3, and the bonding pad 3 and the bend K4 to the length AL of the bonding wire between the bonding pad 3 and the inner lead 4 as viewed from above the major surface of the chip 2 are set, and the set ratios are given to an input unit included in the wire bonding apparatus. The controller of the wire bonding apparatus controls the operation of the guide pipe on the basis of the set ratios. Thus, the bends K1 K2, K3 and K4 are formed in the bonding wire 5 at distances L1, L2, L3 and L4, respectively, from the free end of the wire on the side of the chip 2.

The bends K1 to K4 formed by the wire bonding apparatus are apart from the chip 2 and are electrically isolated from conductive parts of the chip 2. The bonding wires 5 interconnects the plurality of bonding pads 3 distributed in a peripheral area and a central area of the surface of the chip 2, and the plurality of inner leads 4 formed at different positions on the lead frame.

As apparent from the foregoing description, the wire bonding apparatus in the fifth embodiment determines the set ratios of the distances between the bonding pad 3 and the bend K1, the bonding pad 3 and the bend K2, the bonding pad 3 and the bend K3, and the bonding pad 3 and the bend K4 to the length AL of the bonding wire, and forms the bends K1 to K4 on the basis of the set ratios. Therefore, a plurality of bonding wires 5 respectively having different lengths AL can be formed in similar shapes, respectively. Thus, the mechanically strong bonding wires 5 of the semiconductor device are capable of reliably preventing the shorting of the chip 2 by the bonding wires 5. The bonding pads 3 can be arranged at optional positions on the chip 2, and hence the degree of freedom of designing the layout of the internal circuit of the chip 2 can be increased.

Although the wire bonding apparatus in the fifth embodiment leads the bonding wire 5 from the bonding pad 3 toward the inner lead 4, the present invention is applicable to a wire bonding apparatus which leads the bonding wire 5 from the inner lead 4 toward the bonding pad 3. In this case, the same effects as those in the fifth embodiment can be obtained.

Sixth Embodiment

Figure 6:
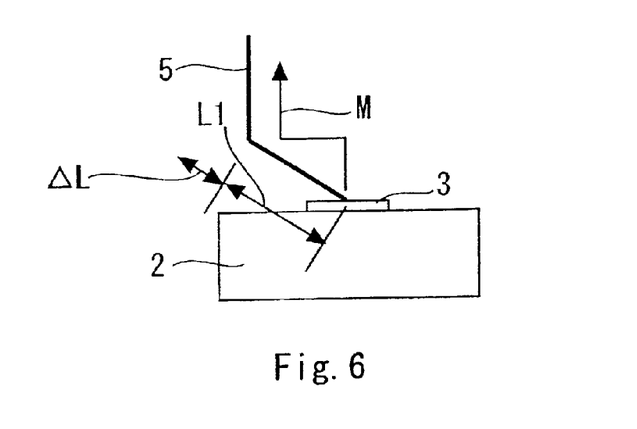
FIG. 6 is a schematic diagram of a semiconductor device fabricated by a method using a wire bonding apparatus according to the sixth embodiment of the present invention.

Hereinafter, a sixth embodiment according to the present invention will be described with reference to FIG. 6. FIG. 6 is a schematic diagram of a semiconductor device fabricated by a method using a wire bonding apparatus according to the sixth embodiment of the present invention.

Referring to FIG. 6, there are shown a chip 2, a bonding pad 3, and a bonding wire 5. A die pad and inner leads are omitted for simplicity.

The wire bonding apparatus, not shown, interconnects the bonding pad 3 and an inner lead by a bonding wire 5.

A guide pipe included in the wire bonding apparatus is moved stepwise to form a plurality of bends sequentially in the bonding wire 5. The overall length of the bonding wire 5 is corrected according to an error (correction) $\Delta L$ in the position of the bend from a correct position.

More specifically, the respective ratios of the distances between the bonding pad 3 and the bends to the overall length of the bonding wire are set, and the set ratios and the overall length of the bonding wire are given to an input unit included in the wire bonding apparatus.

A controller included in the wire bonding apparatus controls the operation of a guide pipe on the basis of the set ratios so that the guide pipe moves along a stepped path indicated by the arrow M in FIG. 6. Thus, a bends K1 is formed in the bonding wire 5 at a distance L1 from a free end of the bonding wire 5 on the bonding pad 3.

Suppose that the guide pipe is moved a distance longer or shorter than the predetermined distance L1 by the error $\Delta L$. The controller of the wire bonding apparatus holds (stores) the error $\Delta L$, and adds the absolute value of the error $\Delta L$ to or subtracts the same from the overall length AL of the bonding wire for adjustment. For example, an adjusted overall length of the bonding wire 5 is AL+$\Delta L$.

Thus the overall length of the bonding wire 5 is adjusted minutely and hence the bonding wire 5 can be bent in a shape similar to a predetermined shape of the bonding wire 5.

As apparent from the foregoing description, the wire bonding apparatus in the sixth embodiment is capable of stably feeding the bonding wire 5 and shaping the bonding wire 5 in a highly mechanically strong structure even if the bend is formed at an incorrect position on the bonding wire 5 and of reliably preventing the shorting of the chip 2 by the bonding wires 5. The bonding pads 3 can be arranged at optional positions on the chip 2, and hence the degree of freedom of designing the layout of the internal circuit of the chip 2 can be increased.

The wire bonding apparatus in the sixth embodiment corrects the overall length of the bonding wire 5 by adding the absolute value of the error $\Delta L$ in the position of the bend K1 or subtracting the same from the overall length AL of the bonding wire 5. The overall length of the bonding wire 5 may be corrected (AL$\pm\Delta L\times$AL/L1) by adding a value ($\Delta L\times$AL/L1) obtained by dividing the error ($\Delta L$) by the ratio of the length (L1) to the overall length (AL) to or subtracting the same from the overall length (AL). In this case, the same effects as those in the sixth embodiment can be obtained.

Seventh Embodiment

Figure 7A:
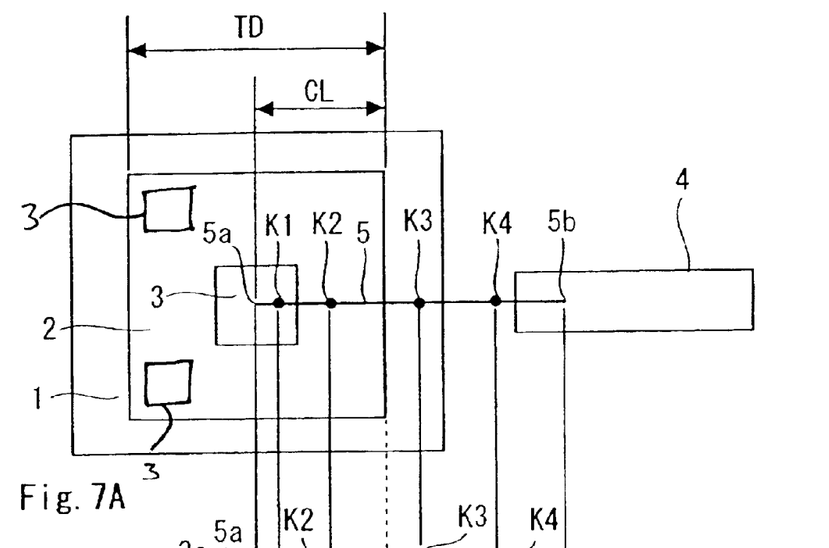
FIGS. 7A and 7B are a schematic top view and a schematic front elevation, respectively, of a semiconductor device fabricated by a method using a wire bonding apparatus according to the seventh embodiment of the present invention.
Figure 7B:
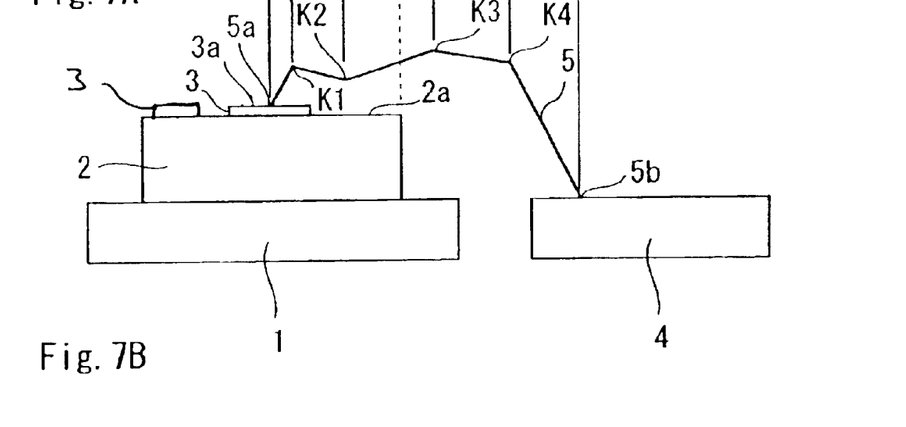

Hereinafter, a seventh embodiment according to the present invention will be described with reference to FIGS. 7A and 7B. FIGS. 7A and 7B are a schematic top view and a schematic front elevation, respectively, of a semiconductor device fabricated by a method using a wire bonding apparatus according to the seventh embodiment of the present invention.

Shown in FIGS. 7A and 7B are a die pad 1, a chip 2, a bonding pad 3, an inner lead 4, a bonding wire 5, an inner end 5a on the side of the chip 2 of the bonding wire 5, an outer end 5b on the side of the inner lead 4 of the bonding wire 5, and bends K1 to K4 in the bonding wire 5.

The wire bonding apparatus, not shown, interconnects the bonding pad 3 and the inner lead 4 by the bonding wire 5. A guide pipe moves stepwise to form the bends K1, K2, K3 and K4 sequentially in that order from the bonding pad 3 toward the lead 4.

More specifically, the length CL of a segment extending over the chip 2 of the bonding wire 5 between the center of the bonding pad 3 and an edge of the chip 2 as viewed from above the major surface of the chip 2 is calculated. The length CL of the segment of the bonding wire 5 is calculated on the basis of the length TD of the chip 2 as viewed from above the major surface of the chip 2, and the coordinates of the opposite ends 5a and 5b of the bonding wire 5 as viewed from above the major surface of the chip 2. Numerical data on the position of the bonding pad 3 on the chip 2, i.e., the position of the end 5a on the chip 2, is stored beforehand in the wire bonding apparatus.

Subsequently, data on the respective positions of the bends K1 to K4 is determined automatically on the basis of the calculated length CL as data for determining the positions of the bends K1 to K4 such that the bonding wire 5 may not short the chip 2.

The operation of the guide pipe is controlled on the basis of the automatically determined data to form the bends K1 to K4. The bends K1 to K4 formed by the wire bonding apparatus in the seventh embodiment are apart from the surface 2a of the chip 2 and are electrically isolated from conductive parts of the chip 2.

As apparent from the foregoing description, the wire bonding apparatus in the seventh embodiment calculates the length CL of the segment extending over the chip 2 of the bonding wire 5, and determines the positions of the bends K1 to K4 on the basis of the calculated length CL. Shorting of the chip 2 by the bonding wire 5 can be reliably prevented, the bonding wire 5 can be fed stably and can be formed in a structure having a high mechanical strength. The bonding pads 3 can be arranged at optional positions on the chip 2, and hence the degree of freedom of designing the layout of the internal circuit of the chip 2 can be increased.

Eighth Embodiment

Figure 8:
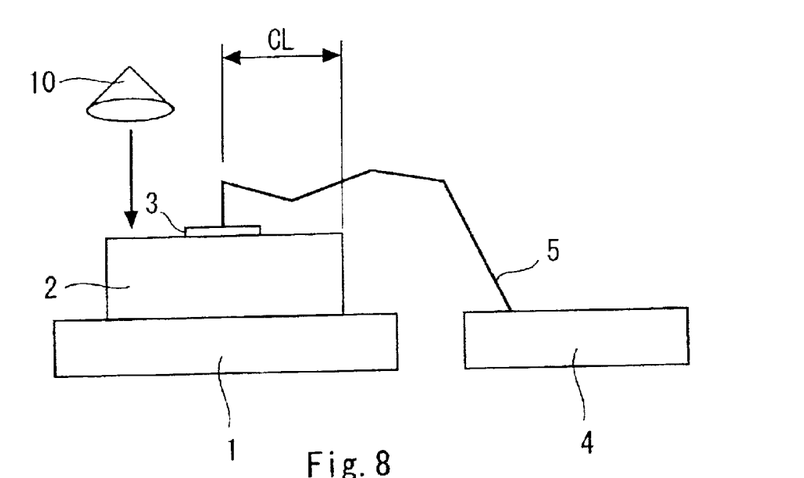
FIG. 8 is a schematic diagram of a semiconductor device fabricated by a method using a wire bonding apparatus according to the eighth embodiment of the present invention.

Hereinafter, an eighth embodiment according to the present invention will be described with reference to FIG. 8. FIG. 8 is a schematic diagram of a semiconductor device fabricated by a method using a wire bonding apparatus according to the eighth embodiment of the present invention. The wire bonding apparatus in the eighth embodiment differs from the wire bonding apparatus in the seventh embodiment in that the former is provided with a position detector for measuring the position of a chip 2.

Shown in FIG. 8 are a die pad 1, a chip 2, a bonding pad 3, an inner lead 4, a bonding wire 5, and a position detector 10 for measuring the position of the chip 2 on the die pad 1.

The wire bonding apparatus, not shown, calculates the length CL of a segment extending over the chip 2 of the bonding wire 5, and forms the plurality of bends K1 to K4.

The calculated length CL is adjusted on the basis of an error in the position of the chip 2 measured by the position detector 10 from a correct position. The position of the bonding pad 3 formed on the chip 2 relative to the inner lead 4 changes if the position of the chip 2 on the die pad 1 changes. The position of the chip 2 on the die pad 1 must be measured accurately to achieve reliable bonding of the bonding pad 3 and the inner lead 4 by the bonding wire 5. More concretely, the position detector 10 is, for example, an optical position detector capable of measuring the respective positions of end surfaces of the chip 2 and a pattern formed on the chip 2. The calculated length CL of the segment extending over the chip 2 of the bonding wire 5 is adjusted on the basis of errors in those positions.

Then, the positions of the bends K1 to K4 are determined automatically by using the adjusted calculated length CL as data for determining the positions of the bends K1 to K4 so that the bonding wire 5 may not short the chip 2.

The operation of a guide pipe included in the wire bonding apparatus is controlled on the basis of the automatically determined positions of the bends K1 to K4 to form the bends K1 to K4.

The bends K1 to K4 formed in the bonding wire 5 by the wire bonding apparatus in the eighth embodiment are apart from the surface 2a of the chip 2 and are electrically isolated from conductive parts formed on the chip 2.

As apparent from the foregoing description, according to the present invention, the wire bonding apparatus in the eighth embodiment calculates the length CL of the segment extending over the chip of the bonding wire 5 and determines the positions of the bends K1 to K4 on the basis of the calculated length CL. Thus, the shorting of the chip 2 by the bonding wire 5 can be reliably prevented, the bonding wire 5 can be fed stably and can be formed in a structure having a high mechanical strength. The bonding pads 3 can be arranged at optional positions on the chip 2, and hence the degree of freedom of designing the layout of the internal circuit of the chip 2 can be increased.

Ninth Embodiment

Figure 9:
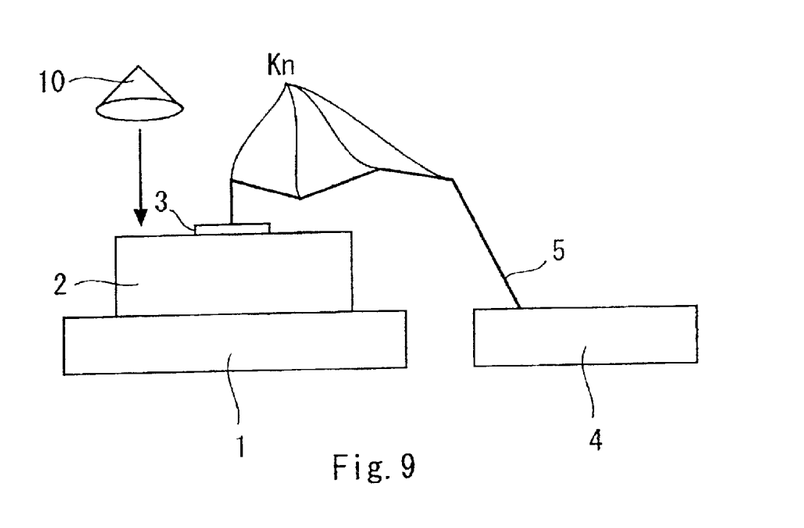
FIG. 9 is a schematic diagram of a semiconductor device fabricated by a method using a wire bonding apparatus according to the ninth embodiment of the present invention.

Hereinafter, a ninth embodiment according to the present invention will be described with reference to FIG. 9. FIG. 9 is a schematic diagram of a semiconductor device fabricated by a method using a wire bonding apparatus according to the ninth embodiment of the present invention. The wire bonding apparatus in the ninth embodiment is a combination of the features of the sixth and eighth embodiments.

Shown in FIG. 9 are a die pad 1, a chip 2, a bonding pad 3, an inner lead 4, a bonding wire 5, and a position detector 10 for measuring the position of the chip 2 on the die pad 1.

In the ninth embodiment, the bonding wire 5 is formed as described below. The position detector 10, similarly to the position detector included in the wire bonding apparatus in the eighth embodiment, measures the position of the chip 2 on the die pad 1, and calculates the length of a segment extending over the chip 2 of the bonding wire 5 on the basis of the measured position of the chip 2 on the die pad 1. Then, the positions of bends Kn are determined on the basis of the calculated length of the segment extending over the chip 2 of the bonding wire 5 so that the chip 2 may not be shorted by the bonding wire 5. The operation of a guide pipe included in the wire bonding apparatus is controlled on the basis of the thus determined positions of the bends Kn so that the bends Kn are formed in the bonding wire 5.

If the position of the bend Kn includes an error, the overall length of the boding wire 5 is corrected according to the error similarly to that in the sixth embodiment.

As apparent from the foregoing description, the wire bonding apparatus in the ninth embodiment is capable of stably feeding the bonding wire 5 and shaping the bonding wire 5 in a highly mechanically strong structure even if the bend is formed at an incorrect position on the bonding wire 5 and of reliably preventing the shorting of the chip 2 by the bonding wires 5. The bonding pads 3 can be arranged at optional positions on the chip 2, and hence the degree of freedom of designing the layout of the internal circuit of the chip 2 can be increased.

Tenth Embodiment

Figure 10:
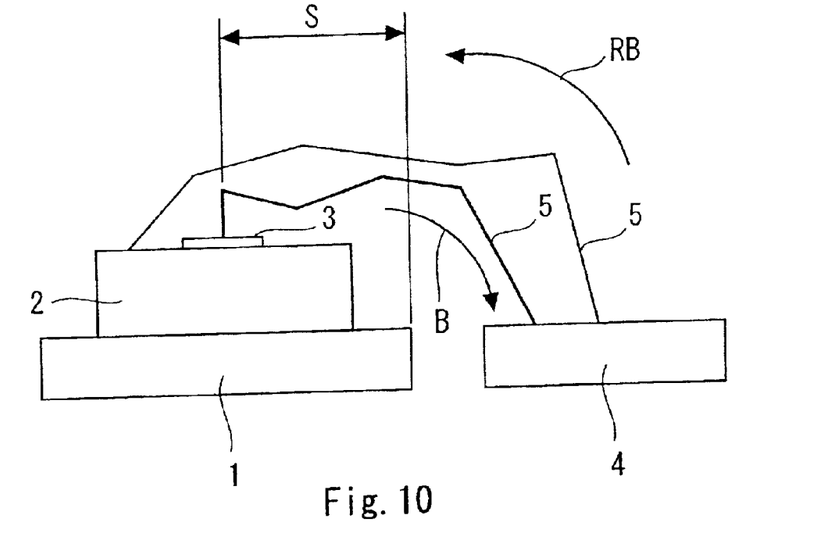
FIG. 10 is a schematic diagram of a semiconductor device fabricated by a method using a wire bonding apparatus according to the tenth embodiment of the present invention.

Hereinafter, a tenth embodiment according to the present invention will be described with reference to FIG. 10. FIG. 10 is a schematic diagram of a semiconductor device fabricated by a method using a wire bonding apparatus according to the tenth embodiment of the present invention. The wire bonding apparatus in the tenth embodiment differs from that in the seventh embodiment in that the former wire bonding apparatus compares the length of a segment extending over a chip of a bonding wire with a predetermined length and decides a direction in which the bonding wire is to be drawn on the basis of the result of comparison.

Shown in FIG. 10 are a die pad 1, a chip 2, a bonding pad 3, an inner lead 4 and a bonding wire 5.

A procedure for determining a direction in which the bonding wire 5 is to be drawn to be carried out by the wire bonding apparatus in the tenth embodiment will be described hereinafter. A set length (threshold) S for a segment extending over the chip 2 of the bonding wire 5 is given to a controller included in the wire bonding apparatus. Then, the wire bonding apparatus, similarly to that in the seventh embodiment, calculates the length of a segment extending over the chip 2 of the bonding wire 5 on the basis of numerical data on the size of the chip 2 and the like. The calculated length of the segment of the bonding wire 5 is compared with the set length S of the segment, and direction of movement of a guide pipe for extending the bonding wire 5, included in the wire bonding apparatus is determined on the basis of the result of comparison.

Suppose that a bonding pad 3 to which an nth bonding wire 5 is to be bonded is in a central part of the surface of the chip 2 and the calculated length of the segment of the bonding wire is shorter than the set length S. Then, the nth bonding wire 5 is drawn in a normal direction B from the bonding pad 3 toward the inner lead 4.

Suppose that a bonding pad 3 to which an (n+1)th bonding wire 5 is to be bonded is on a peripheral part of the surface of the chip 2 on a side remote from the inner lead 4 and the calculated length of the segment of the bonding wire 5 is longer than the set length S. Then, the (n+1)th bonding wire 5 is drawn in a reverse direction RB from the inner lead 4 toward the bonding pad 3.

Thus, the respective calculated lengths of the segments extending over the chip 2 of the bonding wires 5 are compared with the set length S, and the directions in which the bonding wires 5 are to be drawn are determined on the basis of the result of comparison.

As apparent from the foregoing description, the wire bonding apparatus in the tenth embodiment is capable of stably feeding the bonding wire 5 and shaping the bonding wire 5 in a highly mechanically strong structure and of reliably preventing the shorting of the chip 2 by the bonding wires 5. The bonding pads 3 can be arranged at optional positions on the chip 2, and hence the degree of freedom of designing the layout of the internal circuit of the chip 2 can be increased.

Since the direction in which the bonding wire 5 is to be drawn is determined according to the length of the segment extending over the chip 2 of the bonding wire 5, bends can be formed relatively easily in the bonding wire 5.

The features and advantages of the present invention may be summarized as follows.

In the semiconductor device, the bends may be apart form the chip and are electrically insulated from conductive parts on the chip.

In the semiconductor device, the chip may be provided on its surface with electrically insulating parts, and at least one of the plurality of bends may be in contact with the electrically insulating part of the chip so as to be insulated from the conductive parts of the chip.

In the semiconductor device, the chip and the plurality of inner leads may be sealed in a sealing resin package, and the bonding wires may be sealed in the sealing resin package such that at least one of the plurality of bends is exposed on a surface of the sealing resin package.

In the semiconductor device, the nearest bend to the inner lead among the plurality of bends of each bonding wire may be located at a position at a distance from a limit on the side of the corresponding inner lead of a range extending over the chip toward the corresponding inner lead.

In the semiconductor device, the nearest bend to the corresponding inner lead among the plurality of bends of each bonding wire may be at a level higher than that of the nearest bend to the chip.

In the wire bonding apparatus, the bends may be apart form the chip and are electrically insulated from conductive parts on the chip.

In the wire bonding apparatus, the chip may be provided on its surface with electrically insulating parts, and at least one of the plurality of bends may be in contact with the electrically insulating part of the chip so as to be insulated from the conductive parts of the chip.

In the wire bonding apparatus, the nearest bend to the inner lead among the plurality of bends of each bonding wire may be located at a position at a distance from a limit on the side of the corresponding inner lead of a range extending over the chip toward the corresponding inner lead.

In the wire bonding apparatus, the nearest bend to the corresponding inner lead among the plurality of bends of each bonding wire may be at a level higher than that of the nearest bend to the chip.

In the wire bonding apparatus, data on an error in the position of each bend may be held, and the overall length of the bonding wire may be corrected according to the data on the error in the position of each bend.

In the wire bonding apparatus, the correction of the overall length of the bonding wire may be achieved by adding an absolute value of the error in the position of each bend to or subtracting an absolute value of the error in the position of each bend from the overall length of the bonding wire.

In the wire bonding apparatus, the correction of the overall length of the bonding wire may be achieved by adding a value obtained by dividing the error in the position of each bend by the ratio of the distance between the bonding pad and the bend to or subtracting a value obtained by dividing the error in the position of each bend by the ratio of the distance between the bonding pad and the bend from the overall length of the bonding wire.

In the wire bonding apparatus, a length of a segment between the bonding pad and an edge on the side of the inner lead of the bonding wire as viewed from above a major surface of the chip may be calculated before forming the plurality of bends.

In the wire bonding apparatus, the length of the segment extending over the chip of the bonding wire may be calculated on the basis of a size of the chip as viewed from above the major surface of the chip, and coordinates of opposite ends of the bonding wire as viewed from above the major surface of the chip.

In the wire bonding apparatus, the wire bonding apparatus may include a position detector for measuring position of the chip on a die pad included in the leadframe, a calculated length of the segment extending over the chip of the bonding wire may be adjusted on the basis of an error in the position of the chip measured by the position detector.

In the wire bonding apparatus, a set value for the length of the segment extending over the chip of the bonding wire may be determined beforehand, a direction in which the bonding wire is to be drawn may be determined on the basis of comparison between the calculated length of the segment extending over the chip of the bonding wire and the set value.

In the wire bonding apparatus, the bonding wire may be shaped such that the bonding pads can be disposed at optional positions on the surface of the chip.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-256892, filed on Aug. 27, 2001 including specification, claims, drawings and summary, on which the Convention priority of the present application is based, are incorporated herein by reference in its entirety.

What is claimed is:

1. A semiconductor device comprising:

a chip;

a plurality of bonding pads provided on said chip;

a plurality of inner leads arranged opposite said bonding pads; and a plurality of bonding wires electrically connecting said bonding pads and the corresponding inner leads, respectively;

wherein each of said bonding wires has a plurality of bends electrically isolated from conductive parts on said chip, and said bonding pads are arranged at optional positions on a surface of said chip, and the nearest bend to the corresponding inner lead among said plurality of bends of each bonding wire is at a level higher than that of the nearest bend to said chip.

2. The semiconductor device according to claim 1, wherein said bends are apart from said chip and are electrically insulated from conductive parts on said chip.

3. The semiconductor device according to claim 1, wherein said chip is provided on its surface with electrically insulating parts, and at least one of said plurality of bends is in contact with said electrically insulating part of said chip so as to be insulated from the conductive parts of said chip.

4. The semiconductor device according to claim 1, wherein the nearest bend to said inner lead among said plurality of bends of each bonding wire is located at a position outside a range, the range extending over said chip and defined by edges of said chip.

5. A semiconductor device comprising:

a chip;

a plurality of bonding pads provided on said chip;

a plurality of inner leads arranged opposite to said bonding pads; and a plurality of bonding wires electrically connecting said bonding pads and the corresponding inner leads, respectively;

wherein each of said bonding wires has a plurality of bends electrically isolated from conductive parts on said chip, and said bonding pads are arranged at optional positions on a surface of said chip, said chip and said plurality of inner leads are sealed in a sealing resin package, and said bonding wires are scaled in said sealing resin package such that at least one of said plurality of bends is exposed on a surface of said sealing resin package.

* * * * *